US012244302B2

(12) United States Patent
Kanda

(10) Patent No.: US 12,244,302 B2
(45) Date of Patent: Mar. 4, 2025

(54) SEMICONDUCTOR DEVICE

(71) Applicant: SHINDENGEN ELECTRIC MANUFACTURING CO., LTD., Tokyo (JP)

(72) Inventor: Ryo Kanda, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 317 days.

(21) Appl. No.: 17/670,506

(22) Filed: Feb. 14, 2022

(65) Prior Publication Data

US 2022/0263505 A1 Aug. 18, 2022

(30) Foreign Application Priority Data

Feb. 16, 2021 (JP) .................................. 2021-022458

(51) Int. Cl.
*H01L 29/10* (2006.01)
*H01L 29/40* (2006.01)
(Continued)

(52) U.S. Cl.
CPC ..... *H03K 17/6871* (2013.01); *H01L 29/1033* (2013.01); *H01L 29/402* (2013.01);
(Continued)

(58) Field of Classification Search
CPC .......... H02M 1/00–08; H01L 29/0615; H01L 29/7835; H01L 29/1033; H01L 27/0629;
(Continued)

(56) References Cited

U.S. PATENT DOCUMENTS

| 5,883,547 A | 3/1999 | Diazzi et al. |
| 6,121,666 A | 9/2000 | Burr |

(Continued)

FOREIGN PATENT DOCUMENTS

| CN | 101882885 A | * 11/2010 | ..... H01L 21/823481 |
| CN | 105391440 A | 3/2016 | |

(Continued)

OTHER PUBLICATIONS

Jian-Hsing Lee et al., "The Influence of NBL Layout and Locos Space on Component ESD and System Level ESD for HV-LDMOS", Proceedings of the 19th international Symposium on Power Semiconductor Devices & ICs, May 27-30, 2007, pp. 173-176, Korea, 4pp.

(Continued)

*Primary Examiner* — Walter H Swanson
*Assistant Examiner* — Moataz Khalifa
(74) *Attorney, Agent, or Firm* — HAUPTMAN HAM, LLP

(57) ABSTRACT

A semiconductor device includes: a semiconductor base body including: a p-type substrate; and an n-type first semiconductor layer; a first electrode; a second electrode; an isolation film; an insulation film; and a third electrode disposed over the insulation film. The first electrode is electrically connected to a first circuit C1 that is connected to a first power source Vin. The second electrode is electrically connected to a second circuit C2 that is connected to a second power source Vcc. The semiconductor base body further includes a p-type back gate region that is formed in at least a region of the semiconductor base body that faces the third electrode by way of the insulation film with a depth that allows the back gate region to reach the substrate. A dopant concentration of the back gate region falls within a range of $1\times10^{10}$ cm$^{-3}$ to $1\times10^{15}$ cm$^{-3}$.

15 Claims, 5 Drawing Sheets

(51) Int. Cl.
*H01L 29/78* (2006.01)
*H03K 17/30* (2006.01)
*H03K 17/687* (2006.01)
*H03K 17/51* (2006.01)

(52) U.S. Cl.
CPC ....... *H01L 29/7835* (2013.01); *H03K 17/302* (2013.01); *H03K 2017/515* (2013.01)

(58) Field of Classification Search
CPC ......... H01L 29/66659; H01L 29/66484; H01L 29/7831
See application file for complete search history.

(56) References Cited

U.S. PATENT DOCUMENTS

| | | | |
|---|---|---|---|
| 9,391,197 | B1 | 7/2016 | Pu et al. |
| 10,461,182 | B1* | 10/2019 | Edwards ............. H01L 29/0882 |
| 2016/0056818 | A1 | 2/2016 | Kanda et al. |
| 2016/0087529 | A1 | 3/2016 | Sakai et al. |
| 2017/0104474 | A1 | 4/2017 | Kanda et al. |
| 2019/0074828 | A1* | 3/2019 | Yamaji .................... H02M 1/08 |
| 2020/0169253 | A1 | 5/2020 | Hano et al. |
| 2021/0044290 | A1* | 2/2021 | Hama ..................... H02M 1/08 |

FOREIGN PATENT DOCUMENTS

| | | | | |
|---|---|---|---|---|
| CN | 105448909 | A | | 3/2016 |
| CN | 106298768 | B | * | 3/2019 ......... H01L 29/0615 |
| CN | 111211681 | A | * | 5/2020 ........... H01L 29/404 |
| JP | H965571 | A | | 3/1997 |

OTHER PUBLICATIONS

Extended European search report in EP Application No. 22154178.2, dated Jul. 5, 2022, 9pp.

* cited by examiner

SEMICONDUCTOR DEVICE

RELATED APPLICATIONS

The present application claims priority to Japanese Application Number 2021-022458, filed Feb. 16, 2021, the disclosure of which is hereby incorporated by reference herein in its entirety.

TECHNICAL FIELD

The present invention relates to a semiconductor device.

BACKGROUND ART

Conventionally, there has been known a power conversion circuit (for example, an invertor) that includes: a high-side switch connected to a high-voltage power source (a direct-current input power source Vin); and a low-side switch connected to the high-side switch. In such a power conversion circuit (hereinafter referred to as a conventional power conversion circuit), in a case where an n-channel transistor having a small ON resistance is used as a high-side switch, to turn on the high-side switch, it is necessary to apply a gate voltage that exceeds a threshold voltage Vgs (Vth) between a gate and a source of the high-side switch. In this case, a source voltage rises to a voltage of a direct-current input power source Vin and hence, it is necessary to apply a gate voltage higher than the voltage of the direct-current input power source Vin. The provision of a bootstrap circuit has been generally known for generating such a gate voltage having a high voltage (for example, see patent literature 1).

FIG. 8 is a circuit diagram illustrating a conventional power conversion circuit 9.

As illustrated in FIG. 8, the conventional power conversion circuit 9 includes a high-side switch Q1, a low-side switch Q2, a gate driver IC 10 (IC: Integrated Circuit), and a bootstrap circuit 20.

The bootstrap circuit 20 has a capacitor 22 (a bootstrap capacitor), and a bootstrap diode 24 that functions as a rectifier element. One electrode of the capacitor 22 is connected to a node N between the high-side switch Q1 and the low-side switch Q2, and the other electrode of the capacitor 22 is connected to a high-side drive circuit 11 of the gate driver IC10. An anode electrode of the bootstrap diode 24 is connected to a drive-use power source Vcc that is a low voltage source, and a cathode electrode of the bootstrap diode 24 is connected to the capacitor 22 and the high-side drive circuit 11. The high-side switch Q1 and the low-side switch Q2 are disposed in a high voltage region, and a low-side drive circuit 12 of the gate driver IC10 is disposed in a region having a relatively low voltage. In general, the capacitor 22 and the bootstrap diode 24 of the bootstrap circuit 20 are as parts externally mounted on the gate driver IC10.

In the conventional bootstrap circuit 20, when the high-side switch Q1 is in an OFF state and the low-side switch Q2 is in an ON state, the capacitor 22 is charged from the drive-use power source Vcc via the bootstrap diode 24. Then, when the low-side switch Q2 is turned off, a voltage Vs at the node N between the high-side switch Q1 and the low-side switch Q2 (a source voltage of the high-side switch Q1) rises to an output voltage of the direct current input power source Vin, and a voltage obtained by superposing a voltage of the capacitor 22 to the voltage Vs at the node N is applied to the high-side drive circuit 11. Accordingly, a gate voltage higher than a voltage of the direct current input power source Vin can be applied to the high-side switch Q1 and hence, the high-side switch Q1 can be turned on.

Further, the bootstrap diode 24 that functions as a rectifier element, when the high-side switch Q1 is in an OFF state and the low-side switch Q2 is in an ON state, allows an electric current to flow from the drive-use power source Vcc toward the capacitor 22 (forward bias), and when a voltage of the capacitor 22 is superposed on the high-side drive circuit 11, the voltage becomes a reverse bias and hence, it is possible to prevent a reverse flow of an electric current from a capacitor 22 side to a drive-use power source Vcc side.

CITATION LIST

Patent Literature

[Patent Literature 1]
Japanese Patent Laid-Open No. 9-65571

SUMMARY OF THE INVENTION

Technical Problem

Recently, along with a demand for downsizing of electric equipment, it is requested that a rectifier element that has been mounted as an external part be incorporated in the gate driver IC10. In this case, it is desirable to realize downsizing of the electric equipment by forming the rectifier element as an integral part of a semiconductor base body. In view of the above, it is considered that a bootstrap diode 24 is formed over a semiconductor base body by using a semiconductor device having the configuration described below (hereinafter referred to as a semiconductor device 900 according to Background Art).

FIG. 9 is a cross-sectional view for describing the semiconductor device 900 according to Background Art.

As illustrated in FIG. 9, the semiconductor device 900 according to Background Art includes: a semiconductor base body 910 that has a p-type (p⁻-type) substrate 911, an n-type (n⁻-type) first semiconductor layer 912, an n-type (n⁺-type) first contact region CR1, and a p-type (p⁺-type) anode region 919; a first electrode 920 that is disposed over the semiconductor base body 910, and is brought into contact with the semiconductor base body 910; a second electrode 930 that is disposed at a position spaced apart from the first electrode 920 over the semiconductor base body 910, and is brought into contact with the semiconductor base body 910; an isolation film 940 that is formed in a region on a surface of the semiconductor base body 910 between the first electrode 920 and the second electrode 930; an insulation film 950 that is disposed over the surface of the semiconductor base body 910 between the second electrode 930 and the isolation film 940; and a third electrode 960 that is disposed over the insulation film 950. The p-type anode region 919 and the n-type first semiconductor layer 912 form the bootstrap diode 24.

However, in the semiconductor device 900 according to Background Art, a parasitic transistor that is formed of the p-type anode region 919, the n-type first semiconductor layer 912 and the p-type substrate 911 is turned on. Accordingly, there is a concern that a parasitic current flows between the second electrode 930 and the substrate 911 so that drawbacks such as the increase of a leak current, lowering of a withstand voltage and a breakdown of an element occur. As a result, there exists a problem that it is difficult to form the bootstrap diode that functions as a rectifier element over the semiconductor base body.

The present invention has been made to overcome the above-mentioned problem, and it is an object of the present invention to provide a semiconductor device where, even in a case where a rectifier element is formed over a semiconductor base body, drawbacks such as the increase of a leak current, lowering of a withstand voltage and a breakdown of an element minimally occur, a rectifier element can be formed over the semiconductor base body, and the rectifier element can be incorporated into a gate driver IC.

Solution to Problem

A semiconductor device according to the present invention includes: a semiconductor base body including: a substrate of a first conductivity type; and a first semiconductor layer of a second conductivity type that is formed over the substrate; a first electrode disposed over the semiconductor base body, the first electrode being brought into contact with the semiconductor base body; a second electrode disposed over the semiconductor base body, the second electrode being positioned spaced apart from the first electrode, the second electrode being brought into contact with the semiconductor base body; an isolation film formed over a surface of the semiconductor base body in a region between the first electrode and the second electrode; an insulation film formed over the surface of the semiconductor base body in a region between the second electrode and the isolation film; and a third electrode disposed over the insulation film. The first electrode is electrically connected to a first circuit that is connected to a first power source. The second electrode is electrically connected to a second circuit that is connected to a second power source. The semiconductor base body further includes a back gate region of a first conductivity type that is formed in at least a region of the semiconductor base body that faces the third electrode by way of the insulation film with a depth that allows the back gate region to reach the substrate, a dopant concentration of the back gate region falling within a range of $1 \times 10^{10}$ cm$^{-3}$ to $1 \times 10^{15}$ cm$^{-3}$.

According to the semiconductor device of the present invention, the semiconductor base body has the back gate region of the first conductivity type that is formed in at least the region of the semiconductor base body that faces the third electrode by way of the insulation film with the depth that allows the back gate region to reach the substrate. With such a configuration, the second electrode, the back gate region, the first semiconductor layer, the insulation film, and the third electrode form a field effect transistor. Accordingly, when a voltage Vcc of the second electrode is larger than a voltage Vb of the first electrode, the third electrode is turned on so that an electric current flows from the second electrode to the first electrode and a capacitor can be charged. On the other hand, when the voltage Vcc of the second electrode is smaller than the voltage Vb of the first electrode, the third electrode is turned off so that the electric current can be shut off. Accordingly, the semiconductor device can realize a function of a rectifier element in the same manner as a conventional bootstrap diode.

In a bootstrap circuit, in a case where a bootstrap diode is used as a rectifier element, a voltage drop amounting to a forward voltage that is a characteristic of a diode is generated. Accordingly, a voltage applied to the capacitor from a drive-use power source Vcc is lowered. Accordingly, it is difficult to charge the capacitor to a voltage near the drive-use power source Vcc. On the other hand, according to the semiconductor device of the present invention, the field effect transistor that is formed of the second electrode, the back gate region, the first semiconductor layer, the insulation film, and the third electrode is used as the rectifier element. Accordingly, unlike the case where a bootstrap diode is used, there is no possibility that a voltage drop amounting to a forward voltage is generated and hence, the capacitor can be charged to a voltage near the drive-use power source Vcc (see FIG. 5).

To turn on a field effect transistor, it is necessary to apply a voltage higher than a source electrode between a gate and a source. Accordingly, in a case where a field effect transistor is used as a rectifier element in a bootstrap circuit, the field effect transistor cannot be turned on unless a voltage higher than the drive-use power source Vcc is applied to a gate electrode (a third electrode). In a case where it is intended to set a voltage to be applied to a substrate low, a substrate bias effect is generated so that a threshold voltage becomes higher whereby it is necessary to set the voltage applied to the gate electrode (third electrode) further higher. On the other hand, according to the semiconductor device of the present invention, a dopant concentration in the back gate region falls within the range of $1 \times 10^{10}$ cm$^{-3}$ to $1 \times 10^{15}$ cm$^{-3}$ and hence, a threshold voltage becomes extremely small (near 0V) and hence, a channel can be easily formed. Further, an electric field that expands to the back gate region can be made small and hence, an influence exerted by a substrate bias effect can be reduced. As a result, it is unnecessary to apply a high voltage more than necessary to the third electrode to turn on the semiconductor device and hence, the semiconductor device can be turned on and off with an appropriate voltage.

According to the semiconductor device of the present invention, the semiconductor base body has the back gate region of the first conductivity type that is formed in at least the region of the semiconductor base body that faces the third electrode by way of the insulation film with the depth that allows the back gate region to reach the substrate. With such a configuration, the second electrode, the back gate region, the first semiconductor layer, the insulation film, and the third electrode form a field effect transistor. Accordingly, a parasitic transistor that causes a parasitic current flowing between the second electrode 130 and the substrate is minimally formed. Accordingly, drawbacks such as the increase of a leak current and lowering of a withstand voltage generated by a parasitic current and a breakdown of an element minimally occur and hence, a rectifier element can be formed over the semiconductor base body. As a result, the rectifier element can be incorporated in a gate driver IC.

Further, the semiconductor device according to the present invention includes the isolation film that is formed over the surface of the semiconductor base body in the region between the first electrode and the second electrode so that a semiconductor device having a reduced surface field (RESURF) structure is formed by the substrate and the first semiconductor layer of the semiconductor base body and the isolation film. Accordingly, a voltage applied to the first electrode of a relatively high voltage can be lowered by a voltage drop so that the voltage is made to approximate a voltage of the second electrode connected to a circuit of a relatively low voltage. Accordingly, a region of a relatively high voltage and a region of a relatively low voltage can be formed over the same semiconductor base body.

DESCRIPTION OF EMBODIMENTS

Hereinafter, a semiconductor device according to the present invention is described based on an embodiment illustrated in drawings. The respective drawings are schematic drawings, and do not always strictly reflect actual sizes of constitutional elements.

Embodiment 1

1. Configuration of Power Conversion Circuit 1 According to Embodiment 1

Figure 1:
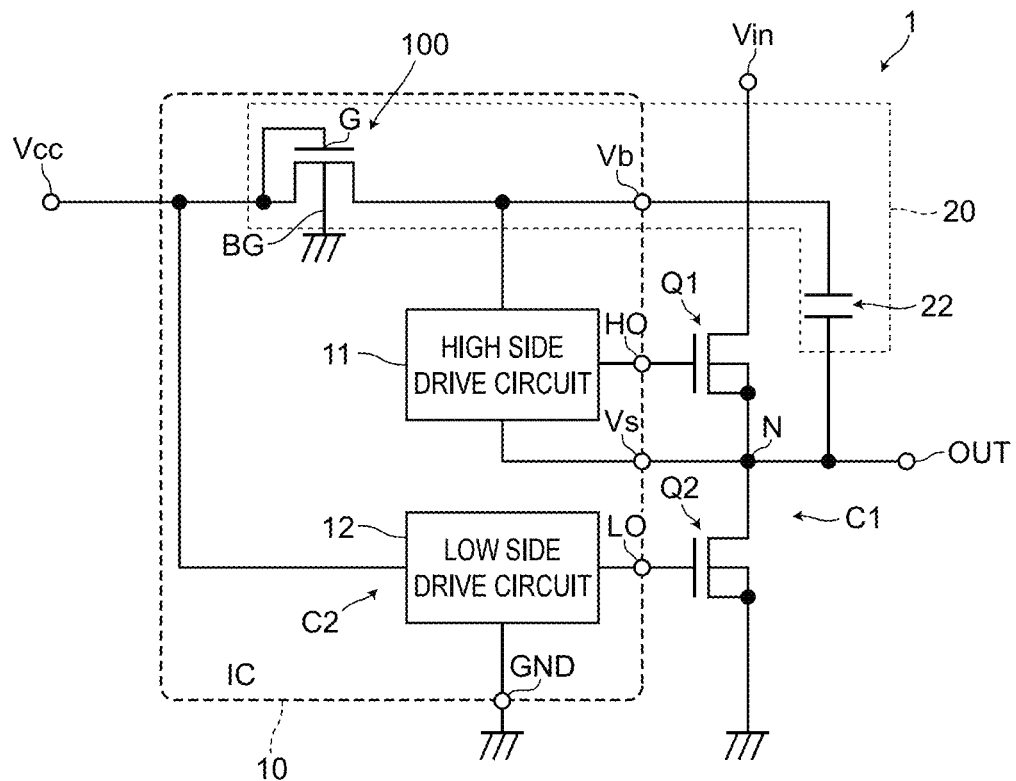
FIG. 1 is a circuit diagram for describing a power conversion circuit 1 according to an embodiment 1.

First, a power conversion circuit 1 of the embodiment 1 is described. A bootstrap field effect transistor (FET) (a semiconductor device 100 according to the embodiment 1) that forms a semiconductor device of the present invention is mounted on the power conversion circuit 1. FIG. 1 is a circuit diagram for describing the power conversion circuit according to the embodiment 1. The power conversion circuit 1 according to the embodiment 1 includes, as illustrated in FIG. 1, a high-side switch Q1, a low-side switch Q2, a capacitor 22, and a gate driver IC10.

The high-side switch Q1 is connected to a direct current input power source Vin. One end of the low-side switch Q2 is connected to the high-side switch Q1, and the other end of the low-side switch Q2 is connected to a reference potential. A suitable switch element can be used as the high-side switch Q1 and the low-side switch Q2. In the embodiment 1, a metal-oxide-semiconductor field-effect transistor (MOSFET) is used.

The high-side switch Q1 and the low-side switch Q2 form a part of a main circuit C1 that forms a first circuit, and an output terminal OUT is connected to a node N between the high-side switch Q1 and the low-side switch Q2. The main circuit C1 is connected to the direct current input power source Vin (first power source).

One electrode of the capacitor 22 is connected to the node N between the high-side switch Q1 and the low-side switch Q2, and the other electrode of the capacitor 22 is connected to a high-side drive circuit 11 of the gate driver IC10. The capacitor 22 is mounted as a part externally mounted the gate driver IC10.

The gate driver IC10 includes the high-side drive circuit 11, a low-side drive circuit 12, the bootstrap FET (the semiconductor device 100 according to the embodiment 1), and a plurality of terminals (a terminal Vb, a terminal Vs, a terminal HO, a terminal LO, and a terminal GND).

The high-side drive circuit 11 controls turning on and off of the high-side switch Q1. The high-side drive circuit 11 is connected to the node N between the high-side switch Q1 and the low-side switch Q2 via the Vs terminal. The high-side drive circuit 11 is connected to the bootstrap FET (the semiconductor device 100 according to the embodiment 1), and is connected to the capacitor 22 via the Vb terminal. The high-side drive circuit 11 is connected to a gate electrode of the high-side switch Q1 via the output terminal HO.

The low-side drive circuit 12 controls turning on and off of the low-side switch Q2. The low-side drive circuit 12 forms a part of the second circuit C2, is connected to a drive-use power source Vcc (second power source), is connected to the ground potential via a GND terminal, and is connected to a gate electrode of the low-side switch Q2 via the output terminal LO. A second power source voltage that is an output voltage of the drive-use power source Vcc (second power source) is lower than a first power source voltage that is an output voltage of the direct current input power source Vin (first power source).

One electrode of the bootstrap FET (the semiconductor device 100 according to the embodiment 1) is connected to the low-side drive circuit 12 and the drive-use power source Vcc, and the other electrode of the bootstrap FET is connected to the capacitor 22 and the high-side drive circuit 11. A gate electrode of the bootstrap FET (the semiconductor device 100 according to the embodiment 1) is connected to an electrode (one electrode) on a drive-use power source Vcc side, and a back gate BG of the bootstrap FET is connected to a reference potential. The bootstrap FET (the semiconductor device 100 according to the embodiment 1) and the capacitor 22 form a bootstrap circuit 20.

As the bootstrap FET of the present invention, a field effect transistor can be used. However, in this embodiment, to incorporate the bootstrap FET in the gate driver IC 10, the semiconductor device 100 according to the embodiment 1 is used where the high-side drive circuit 11 and the low-side drive circuit 12 are provided to the same semiconductor base body 10 of the semiconductor device 100.

2. Configuration of Semiconductor Device 100 According to Embodiment 1

Figure 2:
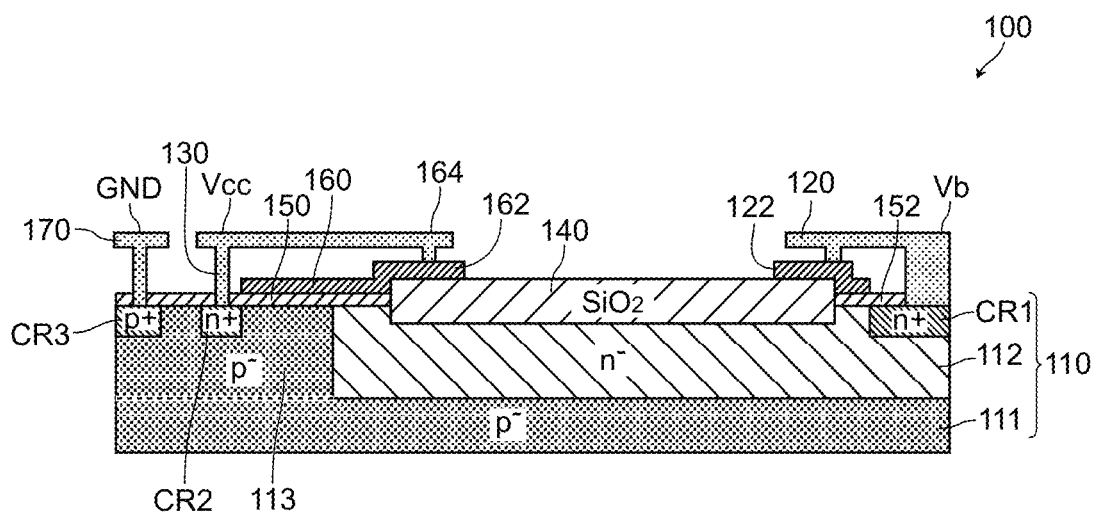
FIG. 2 is a cross-sectional view for describing a semiconductor device 100 according to the embodiment 1.

FIG. 2 is a cross-sectional view illustrating the semiconductor device 100 according to the embodiment 1. As illustrated in FIG. 2, the semiconductor device 100 according to the embodiment 1 includes, a semiconductor base body 110, a first electrode 120, a first field plate 122, a second electrode 130, an isolation film 140, insulation films 150, 152, a third electrode 160, a second field plate 162, a connecting portion 164, and a fourth electrode 170. Although not illustrated in the drawing, at least parts of the high-side drive circuit 11 and the low-side drive circuit 12 are provided to the semiconductor base body 110. The semiconductor device 100 according to the embodiment 1 is incorporated in the gate driver IC10.

The semiconductor base body 110 is made of a predetermined semiconductor material. Over a whole area of a lower side portion of the semiconductor base body 110, a p-type (p⁻-type) substrate 111 is formed. An n-type (n⁻-type) first semiconductor layer 112 is formed over the substrate 111 in a predetermined region. A p-type (p⁻-type) back gate region 113 is formed over the substrate 111 in a region disposed adjacently to the first semiconductor layer 112. A boundary where the first semiconductor layer 112 and the back gate region 113 are disposed adjacently to each other is located at a position that faces the third electrode 160 described later in a state where the insulation film 150 formed over a surface of the semiconductor base body 110 is sandwiched between the boundary and the third electrode 160. A part of the back gate region 113 is formed in a region that faces the third electrode 160 by way of an insulation film 150.

The back gate region 113 has the same composition as the substrate 111, and is continuously formed with the substrate 111. The back gate region 113 is formed with a depth that allows the back gate region 113 to extend from the surface of the semiconductor base body 110 and reach the substrate 111. A dopant concentration of the substrate 111 and the back gate region 113 falls within a range of $1 \times 10^{10}$ cm$^{-3}$ to $1 \times 10^{15}$ cm$^{-3}$. Such a dopant concentration is low compared to a dopant concentration of a back gate region in general.

In the region where the first semiconductor layer 112 is formed, an n-type (n⁺-type) first contact region CR1 is formed over a portion of a surface of the first semiconductor layer 112 in the region on a side opposite to a back gate region 113 side. In other words, the first contact region CR1 is formed over the surface of the first semiconductor layer 112 on the side opposite to the back gate region 113 side with the isolation film 140, described later, interposed between the first contact region CR1 and the back gate region 113. A dopant concentration of the first contact region CR1 is set higher than a dopant concentration of the first semiconductor layer 112.

In the region where the back gate region 113 is formed, an n-type (n⁺-type) second contact region CR2 is formed over a portion of a surface of the back gate region 113. A p-type (p⁺-type) third contact region CR3 is formed over a portion of a surface of the back gate region 113 at a position remoter from the first semiconductor layer 112 than the second contact region CR2 and spaced apart from the second contact region CR2. A dopant concentration of the second contact region CR2 is set higher than a dopant concentration of the first semiconductor layer 112, and a dopant concentration of the third contact region CR3 is set higher than a dopant concentration of the substrate 111.

The isolation film 140 is formed over the surface of the first semiconductor layer 112 at the center of the first semiconductor layer 112. The insulation film 152 is formed over a surface of the semiconductor base body 110 (the first semiconductor layer 112) on a side opposite to the back gate region 113 with respect to the isolation film 140. The insulation film 150 is formed over the surface of the semiconductor base body 110 (the first semiconductor layer 112 and the back gate region 113) on the back gate region 113 side with respect to the isolation film 140. The isolation film 140 is a LOCOS film made of SiO$_2$, and is embedded in the semiconductor base body 110 by an approximately half of a thickness of the isolation film 140. The isolation film 140, the substrate 111 of the semiconductor base body 110 and the first semiconductor layer 112 cooperatively form a reduced surface field (RESURF) structure. The insulation films 150, 152 are each formed of a thermal oxidation film.

The first electrode 120 is disposed at a position over the semiconductor base body 110, and on a side opposite to a side where the back gate region 113 is formed with respect to the isolation film 140. The first electrode 120 is brought into contact with the first contact region CR1 of the semiconductor base body 110 via an opening formed in the insulation film 152. The first electrode 120 is connected to the high-side drive circuit 11 and the capacitor 22, and is electrically connected to a main circuit C1 via the capacitor 22 (see FIG. 1). The first electrode 120 is made of metal (for example, aluminum).

The first field plate 122 is formed so as to cover the insulation film 152 and the isolation film 140 ranging from the surface of the insulation film 152 to the surface of the isolation film 140. The first field plate 122 is connected to the first electrode 120. In the embodiment 1, the first field plate 122 is made of polysilicon. However, the first field plate 122 may be made of metal (for example, aluminum) or silicide (for example, metal silicide such as aluminum silicide (AlSi) or nickel silicide (NiSi)). Alternatively, the first field plate 122 may be made of other suitable conductors.

The second electrode 130 is disposed at a position above and opposite to the first electrode 120 with the isolation film 140 sandwiched between the first electrode 120 and the second electrode 130 (accordingly, the isolation film 140 being formed in a region between the first electrode 120 and the second electrode 130). The second electrode 130 is electrically connected to the drive-use power source Vcc and the low-side drive circuit 12 disposed outside. The second electrode 130 is brought into contact with the second contact region CR2 of the semiconductor base body 110 via an opening formed in the insulation film 150. The second electrode 130 is made of metal (for example, aluminum).

The third electrode 160 is a membrane-like member disposed over the insulation film 150 at a position where the third electrode 160 is brought into contact with the isolation film 140. In this embodiment 1, the third electrode 160 is a membrane-like member. However, the third electrode 160 may not be a membrane-like member. The third electrode 160 faces a portion of the back gate region 113 and a portion of the first semiconductor layer 112 by way of the insulation film 150.

The second field plate 162 is connected to the third electrode 160, and is formed over a surface of the isolation film 140. The second field plate 162 is integrally formed with the third electrode 160. In the embodiment 1, the third electrode 160 and the second field plate 162 are made of polysilicon. However, the third electrode 160 and the second field plate 162 may be made of metal (for example, aluminum) or silicide (for example, metal silicide such as aluminum silicide (AlSi) or nickel silicide (NiSi)). Alternatively, the third electrode 160 and the second field plate 162 may be made of other suitable conductors.

One side of the connecting portion 164 is connected to the second electrode 130, and the other side of the connecting portion 164 extends over the second field plate 162, and is connected to the second field plate 162. The connecting portion 164 may be made of metal (for example, aluminum).

The fourth electrode 170 is connected to the third contact region CR3 and the back gate region 113 of the semiconductor base body 110 via openings formed in the insulation film 150. The fourth electrode 170 is connected to the reference potential outside and hence, the potential of the substrate 111 and the potential of the back gate region 113 become the reference potential.

3. Operation of Semiconductor Device 100 According to Embodiment 1

Figure 3:
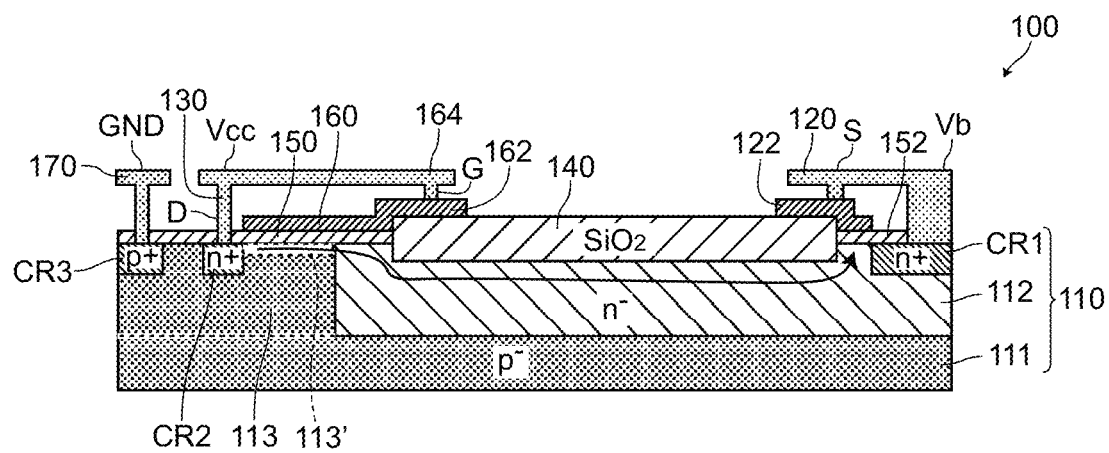
FIG. 3 is a cross-sectional view for describing a mode of the semiconductor device 100 according to the embodiment 1 during a conductive period (during a charging period, Vcc>Vb).
Figure 4:
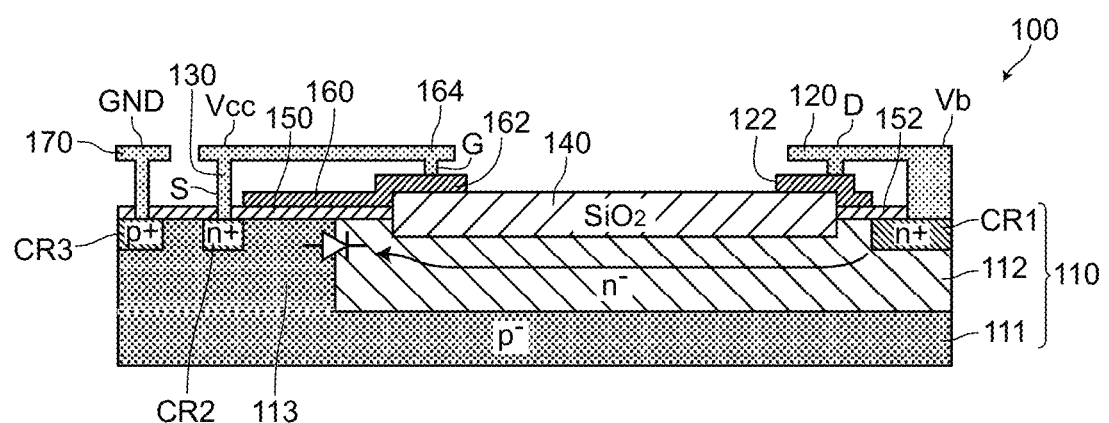
FIG. 4 is a cross-sectional view for describing a mode of the semiconductor device 100 according to the embodiment 1 during a non-conductive period (during a reverse bias applying period, Vcc<Vb).

Next, the description is made with respect to the semiconductor device 100 according to the embodiment 1 that possesses a function as a rectifier element of the bootstrap circuit. FIG. 3 is a cross-sectional view for describing a mode of the semiconductor device 100 according to the embodiment 1 during a conductive period (during a charging period, Vcc>Vb). FIG. 4 is a cross-sectional view for describing a mode of the semiconductor device 100 according to the embodiment 1 during a non-conductive period (during a reverse bias applying period, Vcc<Vb).

(1) Conductive Period (Charging Period, Vcc>Vb)

Next, when a low-side switch Q2 is turned on, a voltage Vcc of a drive-use power source becomes larger than a voltage Vb on a capacitor 22 side. In the semiconductor device 100 according to the embodiment 1, the first electrode 120 is connected to the capacitor 22, and the second electrode 130 is connected to the drive-use power source Vcc. Accordingly, the semiconductor device 100 according to the embodiment 1 has substantially the same configuration as an n-channel metal oxide semiconductor (MOS) in which the first electrode 120 forms a source electrode of the n-channel MOS, the second electrode 130 forms a drain electrode of the n-channel MOS, and the third electrode 160 forms a gate electrode of the n-channel MOS (see FIG. 3). The third electrode 160 that forms the gate electrode is connected to the second electrode 130 that forms the drain electrode. Accordingly, a gate-source voltage is generated so that a state is brought about where the gate electrode is ON whereby a channel region 113' is formed in the back gate region 113 that faces the third electrode 160 with the insulation film 150 sandwiched between the third electrode 160 and the back gate region 113. Accordingly, an electric current flows from the drive-use power source Vcc to the capacitor 22 via the second electrode 130, the channel region 113', the first semiconductor layer 112, the first contact region CR1, and the first electrode 120 so that the capacitor 22 is charged.

(2) Non-Conductive Period (Reverse Bias Applying Period of Body Diode Vcc<Vb)

When the low-side switch Q2 is turned off by switching, a voltage Vs at the node N between the high-side switch Q1 and the low-side switch Q2 rises. Along with such rising of the voltage Vs at the node N, a voltage Vb also rises. Then, a voltage Vcc of the drive-use power source becomes smaller than a voltage Vb on a capacitor 22 side. Accordingly, the semiconductor device 100 according to the embodiment 1 has substantially the same configuration as an n channel MOS in which the first electrode 120 forms a drain electrode of the n-channel MOS, the second electrode 130 forms a source electrode of the n-channel MOS, and the third electrode 160 forms a gate electrode of the n-channel MOS (see FIG. 4). The third electrode 160 that forms the gate electrode is connected to the second electrode 130 that forms the source electrode. Accordingly, a gate-source voltage becomes 0 and hence, the channel region 113' is not formed in the back gate region 113 whereby a state is brought about where the semiconductor device 100 is not ON (the body diode formed of the p-type back gate region 113 and the n-type first semiconductor layer 112 being brought into a reverse bias applying state). Accordingly, when a voltage of the capacitor 22 is superposed on the high-side drive circuit 11, an electric current does not flow from the capacitor 22 to the drive-use power source Vcc and hence, it is possible to prevent a reverse flow of the electric current from the capacitor 22 to the drive-use power source Vcc.

Figure 5:
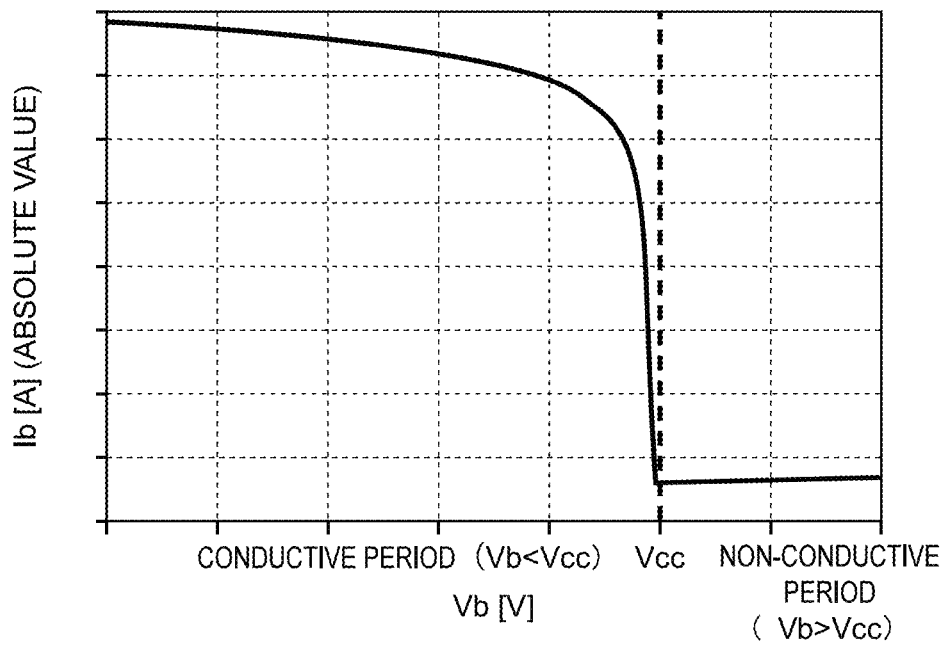
FIG. 5 is a graph illustrating the relationship between a voltage Vb on a first electrode 120 side and a charge current Ib during the conductive period (during the charging period) and during the non-conductive period (during the reverse bias applying period).

Next, a relationship between a voltage Vb and a charge current Ib that flows in the semiconductor device 100 is described. FIG. 5 is a graph illustrating a relationship between the voltage Vb and the charge current Ib that flows in the semiconductor device 100.

As illustrated in FIG. 5, when the voltage Vb is small, a voltage Vcc of the drive-use power source is larger than the voltage Vb on a capacitor 22 side so that the semiconductor device 100 is turned on and the charge current Ib flows from the drive-use power source Vcc to the capacitor 22. When charging of the capacitor 22 continues, the voltage Vb is gradually increased, and when a difference between the voltage Vcc of the drive-use power source Vcc and the voltage Vb of the capacitor 22 becomes smaller, the charge current Ib becomes gradually smaller.

In such a phenomenon, the semiconductor device 100 according to the embodiment 1 that is a field effect transistor is used as a rectifier element and hence, unlike a case where a bootstrap diode is used, a voltage drop minimally occurs. Accordingly, the charge current Ib flows until the voltage Vb becomes a voltage near the voltage Vcc. Further, in the semiconductor device 100 according to the embodiment 1, a dopant concentration of the back gate region 113 is extremely low. Accordingly, even when a threshold voltage is extremely small so that the voltage Vb becomes near the voltage Vcc, a current of the charge current Ib can hold a predetermined value.

When the voltage Vcc of the second electrode becomes substantially equal to the voltage Vb of the first electrode, the charge current Ib is suddenly lowered and scarcely flows. When the voltage Vcc of the second electrode becomes smaller than the voltage Vb of the first electrode, the channel region of the semiconductor device 100 dissipates and becomes a reverse bias applying state and hence, the charge current Ib scarcely flows.

In this manner, the semiconductor device 100 according to the embodiment 1 functions as a rectifier element that controls charging and discharging of the capacitor.

4. Advantageous Effects of Semiconductor Device 100 According to Embodiment 1

According to the semiconductor device 100 of the embodiment 1, the semiconductor base body 110 has the n-type back gate region 113 that is formed in at least the region of the semiconductor base body 110 that faces the third electrode 160 by way of the insulation film 150 with the depth that allows the back gate region 113 to reach the substrate 111. With such a configuration, the second electrode 130, the back gate region 113, the first semiconductor layer 112, the insulation film 150, and the third electrode 160 form a field effect transistor. Accordingly, when a voltage Vcc of the second electrode 130 is larger than a voltage Vb of the first electrode 120, the third electrode 160 is turned on so that an electric current flows from the second electrode 130 to the first electrode 120 and a capacitor can be charged. On the other hand, when the voltage Vcc of the second electrode 130 is smaller than the voltage Vb of the first electrode 120, the third electrode 160 is turned off so that the electric current can be shut off. Accordingly, the semiconductor device 100 can realize a function of a rectifier element in the same manner as a conventional bootstrap diode.

In a bootstrap circuit, in a case where a bootstrap diode is used as a rectifier element, a voltage drop amounting to a forward voltage that is a characteristic of a diode is generated. Accordingly, a voltage applied to the capacitor from a drive-use power source Vcc is lowered. Accordingly, it is difficult to charge the capacitor to a voltage near the drive-use power source Vcc. On the other hand, according to the semiconductor device 100 of the embodiment 1, the field effect transistor that is formed of the second electrode 130, the back gate region 113, the first semiconductor layer 112, the insulation film 150, and the third electrode 160 is used as the rectifier element. Accordingly, unlike the case where a bootstrap diode is used, there is no possibility that a voltage drop amounting to a forward voltage is generated and hence, the capacitor 22 can be charged to a voltage near the drive-use power source Vcc (see FIG. 5).

To turn on a field effect transistor, it is necessary to apply a voltage higher than a source electrode between a gate and a source. Accordingly, in a case where a field effect transistor is used as a rectifier element in a bootstrap circuit, the field effect transistor cannot be turned on unless a voltage higher than drive-use power source Vcc is applied to a gate electrode (a third electrode). In a case where it is intended to set a voltage to be applied to a substrate low, a substrate bias effect is generated so that a threshold voltage becomes higher whereby it is necessary to set the voltage applied to the gate electrode (third electrode) further higher. On the other hand, according to the semiconductor device 100 of the embodiment 1, a dopant concentration in the back gate region 113 falls within the range of $1\times10^{10}$ cm$^{-3}$ to $1\times10^{15}$ cm$^{-3}$ and hence, a threshold voltage becomes extremely small (near 0V) and hence, a channel region 113' can be easily formed. Further, an electric field that expands to the back gate region 113 can be made small and hence, an influence exerted by a substrate bias effect can be reduced. As a result, it is unnecessary to apply a high voltage more than necessary to the third electrode 160 to turn on the semiconductor device and hence, the semiconductor device can be turned on and off with an appropriate voltage.

The reason a dopant concentration of the back gate region 113 is set to $1\times10^{10}$ cm$^{-3}$ or more is as follows. In a case where a dopant concentration of the back gate region 113 is less than $1\times10^{10}$ cm$^{-3}$, a pn junction between the back gate region 113 and the first semiconductor layer 112 cannot form a sufficient potential barrier during a reverse bias applying period and hence, there is a possibility that a reverse current flows between the first electrode 120 and the second electrode 130 during the reverse bias applying period whereby it is difficult for the semiconductor device 100 to hold a function as a rectifier element. The reason the dopant concentration of the back gate region 113 is set to $10^{15}$ cm$^{-3}$ or less is as follows. In a case where the dopant concentration of the back gate region 113 exceeds $10^{15}$ cm$^{-3}$, a threshold voltage is increased so that it is difficult to form the channel region 113' whereby it is necessary to apply a relatively high voltage to the third electrode 160.

According to the semiconductor device 100 of the embodiment 1, the semiconductor base body 110 has the p-type back gate region 113 that is formed in at least the region of the semiconductor base body 110 that faces the third electrode 160 by way of the insulation film 150 with the depth that allows the back gate region 113 to reach the substrate 111 so that a parasitic transistor that causes a parasitic current flowing between the second electrode 130 and the substrate 111 is minimally formed. Accordingly, drawbacks such as the increase of a leak current and lowering of a withstand voltage generated by a parasitic current and a breakdown of an element minimally occur and hence, a rectifier element can be formed over the semiconductor base body. As a result, the rectifier element can be incorporated in the gate driver IC.

Further, the semiconductor device 100 according to the embodiment 1 includes the isolation film 140 that is formed over the surface of the semiconductor base body 110 in the region between the first electrode 120 and the second electrode 130 so that a semiconductor device having a RESURF structure is formed by the substrate 111 and the first semiconductor layer 112 of the semiconductor base body 110 and the isolation film 140. Accordingly, a relatively high voltage applied to the first electrode 120 of a can be lowered by a voltage drop so that the voltage is made to approximate a voltage of the second electrode 130 connected to a circuit of a relatively low voltage. Accordingly, a region of a relatively high voltage and a region of a relatively low voltage can be formed over the same substrate.

According to the semiconductor device 100 of the embodiment 1, the third electrode 160 is connected to the second electrode 130. Accordingly, even when the semiconductor device 100 does not include a drive circuit or the like for switching, when the voltage Vcc of the second electrode 130 is larger than the voltage Vb of the first electrode 120, a forward bias is generated, while when the voltage Vcc of the second electrode 130 is smaller than the voltage Vb of the first electrode 120, a reverse bias is generated. With such a configuration, the semiconductor device 100 of the embodiment 1 becomes a semiconductor device that functions as a rectifier element having a simple configuration.

According to the semiconductor device 100 of the embodiment 1, the substrate 111 is connected to a reference potential and hence, the channel region 113' is easily formed in the back gate region 113 even when a voltage applied to the third electrode 160 is small. An electric field that expands to the back gate region 113 becomes small and hence, an influence exerted by by a substrate bias effect can be reduced.

According to the semiconductor device 100 of the embodiment 1, the first electrode 120 is electrically connected to the drive circuit (high-side drive circuit 11) that controls turning on and off of the high-side switch Q1 of the main circuit C1 and the capacitor 22, and the second electrode 130 is electrically connected to the drive-use power source Vcc. Accordingly, the semiconductor device 100 of the embodiment 1 becomes a semiconductor device that functions as a rectifier element of a bootstrap circuit.

According to the semiconductor device 100 of the embodiment 1, the semiconductor device 100 is formed over the same semiconductor base body at which the high-side drive circuit 11 and the low-side drive circuit 12 that control turning on and off of the switches Q1, Q2 of the first circuit are formed. Accordingly, the semiconductor device 100 that forms a rectifier element can be incorporated in the gate driver IC and hence, it is possible to provide a semiconductor device that can satisfy a demand for downsizing of electric equipment.

According to the semiconductor device 100 of the embodiment 1, the semiconductor base body 110 has the n-type second contact region CR2 having a higher concentration than the first semiconductor layer 112 formed in a region connected to the second electrode 130, and the back gate region 113 is also formed in the region between the second contact region CR2 and the substrate 111. Accordingly, the semiconductor base body 110 can be formed by merely forming the n-type first semiconductor layer 112, the first contact region CR1, the second contact region CR2, and the third contact region CR3 on the p-type semiconductor substrate and hence, it is possible to provide a semiconductor device having the above-mentioned advantageous effects with the simple configuration.

Embodiment 2

Figure 6:
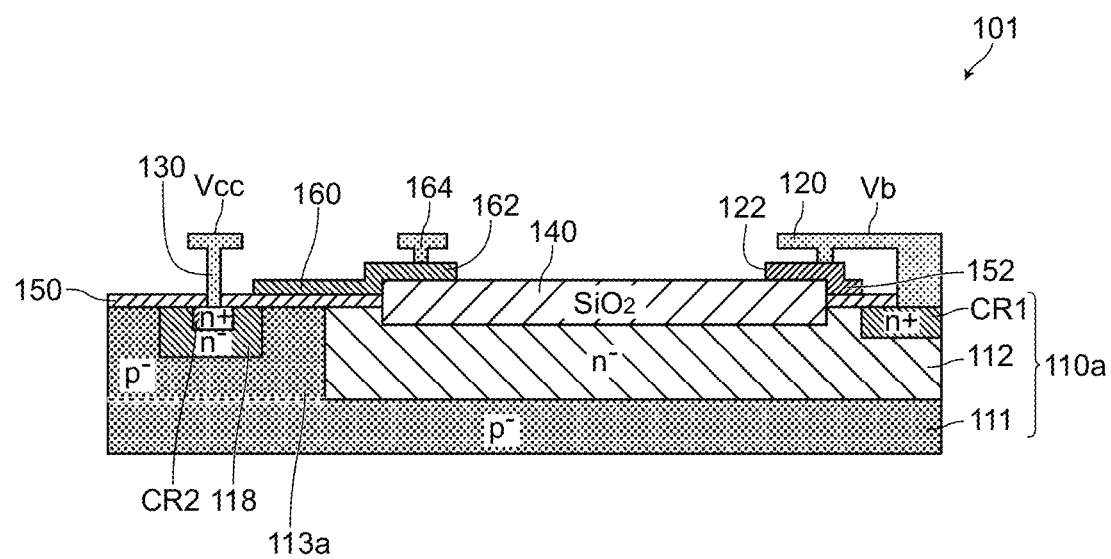
FIG. 6 is a cross-sectional view for describing a semiconductor device 101 according to an embodiment 2.

FIG. 6 is a cross-sectional view for describing a semiconductor device 101 according to the embodiment 2.

The semiconductor device 101 according to the embodiment 2 has basically substantially the same configuration as the semiconductor device 100 according to the embodiment 1. However, the semiconductor device 101 according to the embodiment 2 differs from the semiconductor device 100 according to the embodiment 1 with respect to points that the fourth electrode 170 is not disposed in the semiconductor device 101 according to the embodiment 2, and the semiconductor device 101 according to the embodiment 2 further includes an n-type semiconductor region 118. That is, in the semiconductor device 101 according to the embodiment 2, as illustrated in FIG. 6, the semiconductor base body 110 has the n-type semiconductor region 118 having lower concentration than a second contact region CR2 formed in a region surrounding the second contact region CR2. A dopant concentration of the n-type semiconductor region 118 is lower than a dopant concentration of a first semiconductor layer 112.

In the semiconductor device 101 according to the embodiment 2, although the fourth electrode 170 in the embodiment 1 is not formed, a substrate 111 is connected to a reference potential. Further, a second electrode 130 and a third electrode 160 are not connected to each other, and a channel can be formed in a back gate region 113a by applying a voltage to the third electrode 160.

In this manner, the semiconductor device 101 according to the embodiment 2 differs from the semiconductor device 100 according to the embodiment 1 with respect to the points that the fourth electrode 170 is not formed in the semiconductor device 101 according to the embodiment 2, and the semiconductor device 101 according to the embodiment 2 further includes the n-type semiconductor region 118. However, in the same manner as the semiconductor device 100 according to the embodiment 1, a semiconductor base body 110a has the p-type back gate region 113a that is formed in at least the region of the semiconductor base body 110a that faces the third electrode 160 by way of an insulation film 150 with a depth that allows the back gate region 113a to reach the substrate 111 so that a parasitic transistor that causes a parasitic current flowing between the second electrode 130 and the substrate 111 is minimally formed. Accordingly, drawbacks such as the increase of a leak current and lowering of a withstand voltage generated by a parasitic current and a breakdown of an element minimally occur and hence, a rectifier element can be formed over the semiconductor base body. As a result, the rectifier element can be incorporated in a gate driver IC.

In the semiconductor device 101 according to the embodiment 2, the semiconductor base body 110 includes, in a region connected to the second electrode 130, the n-type second contact region CR2 having a higher concentration than a first semiconductor layer 112, and the n-type semiconductor region 118 formed in a region surrounding the second contact region CR2 and having a lower concentration than the second contact region CR2. Accordingly, during a reverse vias applying period, it is possible to ensure a withstand voltage between the third electrode 160 that forms a gate electrode and the second electrode 130 that forms a source electrode.

The semiconductor device 101 according to the embodiment 2 has substantially the same configuration as the semiconductor device 100 according to the embodiment 1 except for the points that the fourth electrode 170 is not disposed in the semiconductor device 101 according to the embodiment 2, and the semiconductor device 101 according to the embodiment 2 further includes the n-type semiconductor region 118. Accordingly, the semiconductor device 101 of the embodiment 2 acquires corresponding advantageous effects found amongst all advantageous effects that the semiconductor device 100 according to the embodiment 1 acquires.

Embodiment 3

Figure 7:
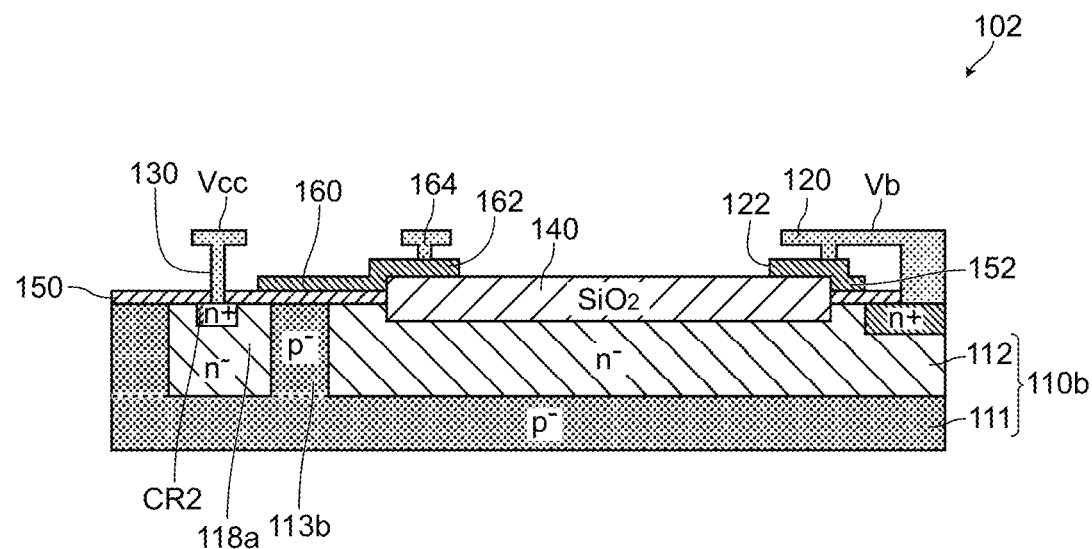
FIG. 7 is a cross-sectional view for describing a semiconductor device 102 according to an embodiment 3.
Figure 8:
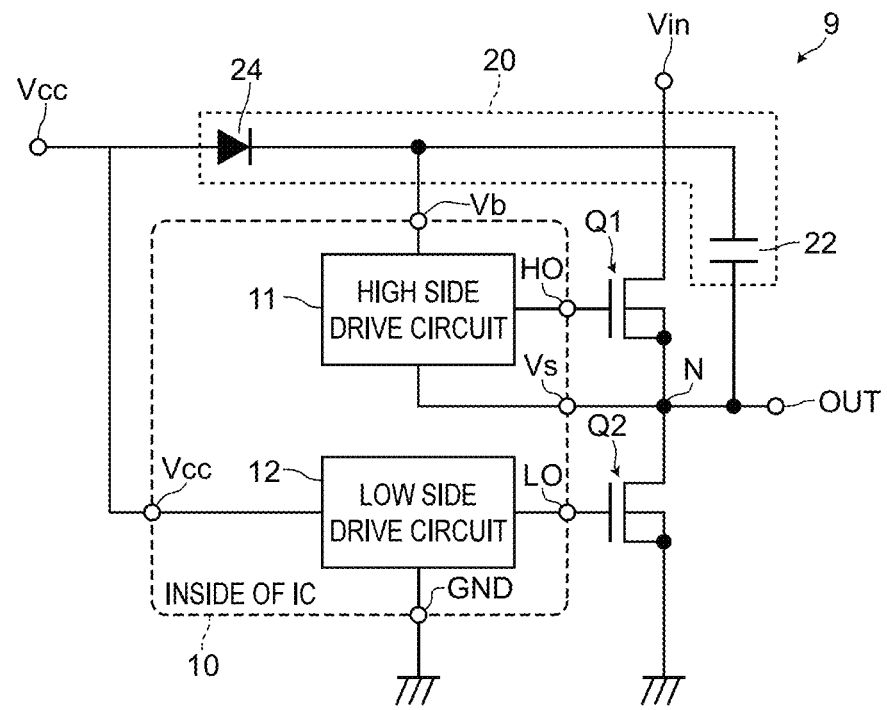
FIG. 8 is a circuit diagram for describing a conventional power conversion circuit 9.
Figure 9:
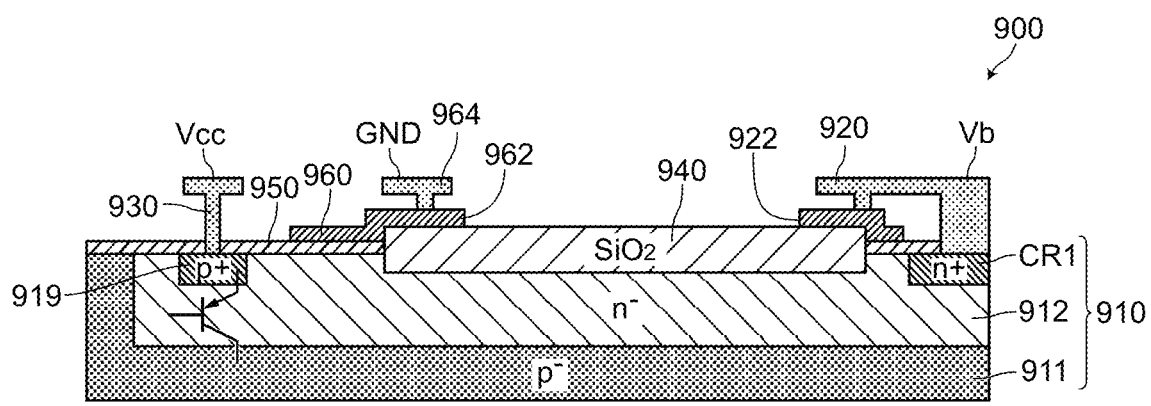
FIG. 9 is a cross-sectional view for describing a semiconductor device 900 according to Background Art, wherein symbol 922 indicates a first field plate, symbol 962 indicates a second field plate, and symbol 964 indicates an external connecting portion.

FIG. 7 is a cross-sectional view for describing a semiconductor device 102 according to the embodiment 3.

The semiconductor device 102 according to the embodiment 3 has basically substantially the same configuration as the semiconductor device 101 according to the embodiment 2. However, the semiconductor device 102 according to the embodiment 3 differs from the semiconductor device 101 according to the embodiment 2 with respect to a point that an n-type semiconductor region 118a is brought into contact with a substrate (see FIG. 7). That is, in the semiconductor device 102 according to the embodiment 3, the n-type semiconductor region 118a is formed in a region that is brought into contact with a second electrode 130 with a depth that allows the n-type semiconductor region 118a to reach a substrate 111. That is, the n-type semiconductor region 118a is brought into contact with the substrate 111.

As methods of forming the n-type semiconductor region 118a and a back gate region 113b, suitable methods can be selectively used. In the embodiment 3, a semiconductor base body is prepared by stacking the substrate 111 and an n-type semiconductor layer to each other, and a columnar (having a columnar shape in cross section) back gate region is formed over the n-type semiconductor layer so that the n-type semiconductor layer is formed in a separated manner as an n-type first semiconductor layer 112 and the n-type semiconductor region 118a. Accordingly, a dopant concentration of the n-type semiconductor region 118a and a dopant concentration of the first semiconductor layer 112 are equal, and the back gate region 113b forms a columnar region that is formed in a region that faces a third electrode 160 by way of an insulation film 150 with a depth that allows the back gate region 113b to reach the substrate 111.

The semiconductor device 102 according to the embodiment 3 differs from the semiconductor device 101 according to the embodiment 2 with respect to the point that the n-type semiconductor region is brought into contact with the substrate. However, in the same manner as the semiconductor device 101 according to the embodiment 2, a semiconductor base body 110b has the p-type back gate region 113b that is formed in at least a region of the semiconductor base body 110b that faces the third electrode 160 by way of the insulation film 150 with a depth that allows the back gate region 113b to reach the substrate 111 so that a parasitic transistor that causes a parasitic current flowing between the second electrode 130 and the substrate 111 is minimally formed. Accordingly, drawbacks such as the increase of a leak current and lowering of a withstand voltage generated by a parasitic current and a breakdown of an element minimally occur and hence, a rectifier element can be formed over the semiconductor base body. As a result, the rectifier element can be incorporated in a gate driver IC.

In the semiconductor device 102 according to the embodiment 3, a dopant concentration of the n-type semiconductor region 118a is equal to a dopant concentration of the first semiconductor layer 112. Accordingly, by forming a columnar back gate region in the n-type semiconductor layer, the n-type semiconductor layer can be formed in a separated manner into the n-type first semiconductor layer 112 and the n-type semiconductor region 118a. Accordingly, it is unnecessary to add a new step for forming the n-type semiconductor region 118a and hence, a semiconductor device can be manufactured by a simple method.

The semiconductor device 102 according to the embodiment 3 has substantially the same configuration as the semiconductor device 101 according to the embodiment 2 except for the point that the n-type semiconductor region is brought into contact with the substrate. Accordingly, the semiconductor device 102 of the embodiment 3 acquires corresponding advantageous effects found amongst all advantageous effects that the semiconductor device 101 according to the embodiment 2 acquires.

The present invention has been described based on the above-mentioned embodiments heretofore. However, the present invention is not limited to the above-mentioned embodiments. Various modes are conceivable without departing from the gist of the present invention. For example, the following modifications are conceivable.

(1) The numbers, the materials, the shapes, the positions, the sizes, and the like of the constitutional elements described in the above-mentioned embodiments are provided for an exemplifying purpose, and these factors can be changed within a scope that the advantageous effects of the present invention are not impaired.

(2) In the above-mentioned embodiment 1, the substrate 111 is connected to the reference potential by providing the fourth electrode. However, the present invention is not limited to such a configuration. The potential of the substrate 111 may be set as the reference potential without providing the fourth electrode, or the substrate 111 may not be connected to the reference potential. Further, in the embodiments 2 and 3, the fourth electrode is not provided. However, the present invention is not limited to such a configuration. The substrate 111 may be connected to the reference potential by providing the fourth electrode, or the potential of the substrate 111 may be set to a potential different from the reference potential.

(3) In the above-mentioned embodiment 1, the third electrode is connected to the second electrode. However, the present invention is not limited to such a configuration. The semiconductor device may be turned on and off by applying a voltage to the third electrode without connecting the third electrode to the second electrode. Further, in the embodiments 2 and 3, the semiconductor device is turned on and off by applying a voltage to the third electrode without connecting the third electrode to the second electrode. However, the present invention is not limited to such a configuration. The third electrode may be connected to the second electrode.

(4) In the above-mentioned respective embodiments, the back gate region is connected to the substrate 111. However, the present invention is not limited to such a configuration. The back gate region may not be connected to the substrate 111. Further, the dopant concentration of the substrate 111 and the dopant concentration of the back gate region may differ from each other.

(5) In the above-mentioned respective embodiments, the semiconductor device is used as the rectifier element of the bootstrap circuit. However, the present invention is not limited to such a configuration. The semiconductor device may be used as a rectifier element other than the rectifier element of the bootstrap circuit.

REFERENCE SIGNS LIST

10: high-side drive circuit
20: low-side drive circuit
22: capacitor
100, 101, 102: semiconductor device
110: semiconductor base body
111: substrate
112: first semiconductor layer
CR1: first contact region
CR2: second contact region
CR3: third contact region
113, 113a, 113b: back gate region
118, 118a: n-type semiconductor region
120: first electrode
130: second electrode
140: isolation film
150, 152: insulation film
160: third electrode
170: fourth electrode
C1: first circuit
C2: second circuit

The invention claimed is:
1. A semiconductor device comprising:
a semiconductor base body including a substrate of a first conductivity type and a first semiconductor layer of a second conductivity type that is over the substrate;
a first electrode over the semiconductor base body, the first electrode contacting the semiconductor base body;
a second electrode over the semiconductor base body, the second electrode being spaced apart from the first electrode, the second electrode contacting the semiconductor base body;
an isolation film over a surface of the semiconductor base body in a region between the first electrode and the second electrode;
an insulation film over the surface of the semiconductor base body in a region between the second electrode and the isolation film; and
a third electrode over the insulation film, wherein the first electrode is configured to electrically connect to a first circuit and to a first power source,
the second electrode is configured to electrically connect to a second circuit and to a second power source, and
the semiconductor base body further includes
a back gate region of a conductivity type which is of the same conductivity type as that of the substrate, in at least a region of the semiconductor base body that faces the third electrode through the insulation film, and the back gate region at least in the region having a depth reaching the substrate, a dopant concentration of the back gate region falling within a range of $1 \times 10^{10}$ cm$^{-3}$ to $1 \times 10^{15}$ cm$^{-3}$.

2. The semiconductor device according to claim 1, wherein a second power source voltage that is an output voltage of the second power source is lower than a first power source voltage that is an output voltage of the first power source.

3. The semiconductor device according to claim 1, wherein the third electrode is configured to electrically connect to the second electrode.

4. The semiconductor device according to claim 1, wherein a predetermined voltage is applied to the third electrode in response to a signal.

5. The semiconductor device according to claim 1, wherein the substrate is configured to connect to a reference potential.

6. The semiconductor device according to claim 1, wherein
the first electrode is configured to electrically connect to a drive circuit configured to control turning on and off of a switch element of the first circuit and a capacitor connected to the drive circuit,
the second electrode is configured to electrically connect to a drive-use power source that is the second power source, and
the drive circuit is provided to the semiconductor base body.

7. The semiconductor device according to claim 1, wherein
the semiconductor base body further includes a contact region of a second conductivity type having a higher dopant concentration than the first semiconductor layer, the contact region of the second conductivity type being in a region connected to the second electrode, and
the back gate region is also in a region between the contact region and the substrate.

8. The semiconductor device according to claim 1, wherein the semiconductor base body further includes:
a contact region of a second conductivity type having a higher dopant concentration than the first semiconductor layer, the contact region of the second conductivity type being in a region connected to the second electrode; and
a semiconductor region of a second conductivity type having a lower dopant concentration than the contact region, the semiconductor region of the second conductivity type being in a region surrounding the contact region, and
the back gate region is also between the semiconductor region of the second conductivity type and the substrate.

9. The semiconductor device according to claim 1, wherein the semiconductor base body further includes:
a contact region of a second conductivity type having a higher dopant concentration than the first semiconductor layer, the contact region of the second conductivity type being in a region connected to the second electrode; and
a semiconductor region of a second conductivity type having a lower dopant concentration than the contact region, the semiconductor region being in a region surrounding the contact region, and
the semiconductor region of the second conductivity type contacts with the substrate.

10. The semiconductor device according to claim 8, wherein a dopant concentration of the semiconductor region of the second conductivity type is equal to a dopant concentration of the first semiconductor layer.

11. The semiconductor device according to claim 8, wherein a dopant concentration of the semiconductor region of the second conductivity type is lower than a dopant concentration of the first semiconductor layer.

12. The semiconductor device according to claim 1, further comprising
a fourth electrode over the semiconductor base body, the fourth electrode connecting to a reference potential, wherein
the back gate region in at least the region faces the second electrode, the third electrode and the fourth electrode, and the back gate region at least the region has the depth reaching to the substrate.

13. The semiconductor device according to claim 1, wherein the back gate region directly contacts the substrate.

14. The semiconductor device according to claim 1, wherein the back gate region is continuous with the substrate.

15. The semiconductor device according to claim 1, wherein
the first semiconductor layer contacts the back gate region at a boundary which faces the third electrode.

* * * * *